US012310239B2

(12) United States Patent
Warren et al.

(10) Patent No.: US 12,310,239 B2
(45) Date of Patent: May 20, 2025

(54) LOW POWER THERMOELECTRIC SYSTEMS

(71) Applicant: EMBR Labs IP LLC, Boston, MA (US)

(72) Inventors: Kristen Warren, Cambridge, MA (US); Locklin George, Boston, MA (US); Sarah Horton, San Carlos, CA (US); Caitlynn Tov, Sacramento, CA (US); Matthew Dowling, Hillsborough, NJ (US); Xuchen He, Malden, MA (US); Matthew J. Smith, Somerville, MA (US)

(73) Assignee: EMBR Labs IP LLC, Boston, MA (US)

( * ) Notice: Subject to any disclaimer, the term of this patent is extended or adjusted under 35 U.S.C. 154(b) by 54 days.

(21) Appl. No.: 17/221,088

(22) Filed: Apr. 2, 2021

(65) Prior Publication Data

US 2021/0399186 A1 Dec. 23, 2021

Related U.S. Application Data

(60) Provisional application No. 63/041,724, filed on Jun. 19, 2020.

(51) Int. Cl.
*H10N 10/80* (2023.01)
*F25B 21/02* (2006.01)

(52) U.S. Cl.
CPC ............ *H10N 10/80* (2023.02); *F25B 21/02* (2013.01); *F25B 2321/0212* (2013.01); *F25B 2321/023* (2013.01)

(58) Field of Classification Search
CPC .......... A61F 7/00–123; A61F 2007/0001–126; H10N 10/00–857; H10N 15/00–20; H10N 19/00–101

(Continued)

(56) References Cited

U.S. PATENT DOCUMENTS 8,397,518 B1 * 3/2013 Vistakula ............. A61F 7/02
62/3.5
2007/0193278 A1 8/2007 Polacek et al.
(Continued)

FOREIGN PATENT DOCUMENTS

JP 2007208066 A * 8/2007

OTHER PUBLICATIONS

JP-2007208066-A English (Year: 2007).*
(Continued)

*Primary Examiner* — Bach T Dinh
(74) *Attorney, Agent, or Firm* — Wolf, Greenfield & Sacks, P.C.

(57) ABSTRACT

A device for manipulating the temperature of a surface may include a heat transfer surface including active portions and a passive portion. The passive portion may include an inner passive portion disposed between each of the active portions and/or may include an outer passive portion that may surround each of the active portions. The active portions may form 40-90% of a total surface area of the heat transfer surface, where total surface area includes active portions and an inner passive portion. The passive portion(s) may have a thermal conductivity less than the active portion. A processor may be in electrical communication with thermoelectric modules defining or forming the active portions to generate a heat flux through the heat transfer surface. The heat flux through the active portions may be between 500 and 15,000 W/m² during nominal operation of the device.

17 Claims, 8 Drawing Sheets

(58) Field of Classification Search
USPC .................................................. 136/200–242
See application file for complete search history.

(56) References Cited

U.S. PATENT DOCUMENTS

| | | | |
|---|---|---|---|
| 2008/0188915 A1* | 8/2008 | Mills ........................ | A61F 7/007 607/112 |
| 2009/0025770 A1* | 1/2009 | Lofy ........................ | H10N 10/13 136/204 |
| 2010/0100004 A1 | 4/2010 | Van Someren | |
| 2013/0085552 A1 | 4/2013 | Mandel | |
| 2013/0086923 A1* | 4/2013 | Petrovski ............... | H10N 10/01 62/3.61 |
| 2013/0087180 A1* | 4/2013 | Stark ........................ | H10N 10/13 136/205 |
| 2015/0101788 A1 | 4/2015 | Smith et al. | |
| 2016/0030233 A1* | 2/2016 | Millar ...................... | F25B 21/02 62/3.2 |
| 2018/0042761 A1* | 2/2018 | Smith ....................... | A61F 7/007 |
| 2019/0110950 A1 | 4/2019 | Smith et al. | |
| 2019/0117444 A1 | 4/2019 | Smith et al. | |
| 2019/0275527 A1* | 9/2019 | Hayes .................. | G05D 23/193 |
| 2020/0035896 A1* | 1/2020 | Jovovic .................. | H01L 35/32 |
| 2020/0050248 A1 | 2/2020 | Smith et al. | |
| 2020/0136005 A1* | 4/2020 | Sun ........................ | H10N 10/17 |
| 2020/0289314 A1 | 9/2020 | Smith et al. | |
| 2020/0289315 A1 | 9/2020 | Smith et al. | |
| 2020/0289359 A1* | 9/2020 | Janson .................. | G09B 21/003 |
| 2020/0345971 A1* | 11/2020 | Schirm ..................... | A61F 7/02 |
| 2020/0352459 A1 | 11/2020 | Lee | |
| 2020/0352777 A1 | 11/2020 | Smith et al. | |
| 2021/0030141 A1* | 2/2021 | Goo ........................ | A61B 90/98 |
| 2021/0085559 A1 | 3/2021 | Smith et al. | |
| 2021/0089097 A1 | 3/2021 | Smith et al. | |
| 2021/0296553 A1* | 9/2021 | Wang ...................... | H10N 10/82 |
| 2021/0315731 A9 | 10/2021 | Smith et al. | |
| 2022/0096317 A1 | 3/2022 | Smith et al. | |
| 2023/0226365 A1 | 7/2023 | Smith et al. | |

OTHER PUBLICATIONS

U.S. Appl. No. 16/214,372, filed Dec. 10, 2018, Smith et al.
U.S. Appl. No. 16/891,821, filed Jun. 3, 2020, Smith et al.
U.S. Appl. No. 15/555,677, filed Sep. 5, 2017, Smith et al.
U.S. Appl. No. 16/891,781, filed Jun. 3, 2020, Smith et al.
U.S. Appl. No. 16/344,577, filed Apr. 24, 2019, Smith et al.
U.S. Appl. No. 17/109,749, filed Dec. 2, 2020, Smith et al.
U.S. Appl. No. 16/129,182, filed Sep. 12, 2018, Smith et al.
U.S. Appl. No. 17/109,790, filed Dec. 2, 2020, Smith et al.
U.S. Appl. No. 16/962,322, filed Jul. 15, 2020, Smith et al.
International Search Report and Written Opinion for International Application No. PCT/US2021/025491, mailed Jul. 9, 2021.

* cited by examiner

LOW POWER THERMOELECTRIC SYSTEMS

RELATED APPLICATIONS

This application claims the benefit under 35 U.S.C. § 119(e) of U.S. Provisional Application Ser. No. 63/041,724, filed Jun. 19, 2020, which is incorporated herein by reference in its entirety.

GOVERNMENT LICENSE RIGHTS

This invention was made with Government support under Grant No. 1831178 awarded by the National Science Foundation. The Government has certain rights in the invention.

FIELD

Disclosed embodiments are related to low power thermoelectric systems and related methods of use.

BACKGROUND

Wearable technology has become of great interest, enabled by the shrinking of sophisticated microelectronics, maturation of wireless communication, and increasing energy density of various battery chemistries. However, wearable technology to date has focused primarily on sensing and data collection. Haptic actuation, and in particular the generation of thermal sensations, has been increasingly recognized as an impactful area for wearable and mobile technology.

Thermoelectric cooling systems have been of great interest for applying cooling to the human body. Also, improving battery capacity has made it possible to integrate electronic devices into wearable technology. Applications for these types of thermoelectric systems for cooling the human body include migraine relief, wrinkle control, thermal relief from menopausal hot flashes, providing personal comfort within buildings, improving human performance in extreme environments, and other appropriate applications. Thermoelectric systems offer several advantages in such applications including low form factors (especially compared with compressor technology), no moving parts which may be mechanically robust and silent, and precise dynamic control over thermal profiles applied by the device.

SUMMARY

In some embodiments, a device for manipulating a temperature of a surface, includes a heat transfer surface configured to be placed in contact with the surface. The heat transfer surface includes an active portion defined by at least one thermoelectric module, where the active portion forms 40-90% of a surface area of the heat transfer surface, and an inner passive portion forming a remaining portion of the surface area of the heat transfer surface. The device also includes a processor in electrical communication with the at least one thermoelectric module, the processor configured to cause the at least one thermoelectric module to generate heat flux through the heat transfer surface, where a heat flux through the active portion is between 500 and 15,000 W/m$^2$.

In some embodiments, a device for manipulating a temperature of a surface includes a heat transfer surface configured to be placed in contact with the surface. The heat transfer surface includes a plurality of active portions formed by a plurality of thermoelectric modules, where each active portion is spaced from adjacent active portions, and where the plurality of active portions has a first thermal conductivity. The heat transfer surface also includes an inner passive portion disposed between each of the active portions, where the inner passive portion has a second thermal conductivity less than the first thermal conductivity. The device also includes a processor in electrical communication with the plurality of thermoelectric modules, the processor configured to cause the plurality of thermoelectric modules to generate heat flux through the heat transfer surface.

In some embodiments, a method of eliciting a thermal sensation includes placing a plurality of active portions of a heat transfer surface in contact with a user's skin, where each active portion includes at least one thermoelectric module, and where each of the plurality of active portions is spaced from adjacent active portions by 2 to 20 mm. The method also includes applying at least one thermal pulse at each of the plurality of active portions of the at least one thermoelectric module.

It should be appreciated that the foregoing concepts, and additional concepts discussed below, may be arranged in any suitable combination, as the present disclosure is not limited in this respect. Further, other advantages and novel features of the present disclosure will become apparent from the following detailed description of various non-limiting embodiments when considered in conjunction with the accompanying figures.

BRIEF DESCRIPTION OF DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings.

DETAILED DESCRIPTION

Figure 1:
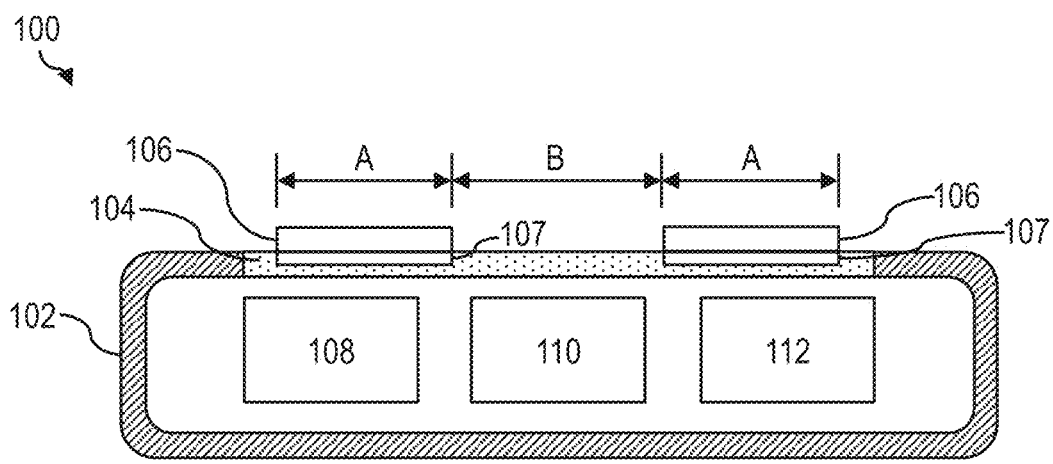
FIG. 1 is a side schematic view of one embodiment of a device for manipulating temperature.

Conventional wearable technology for temperature control faces an array of technical challenges that limit or prevent the use of thermotactile actuation in current mobile and wearable technology. One such limitation is that wearable technology is most often powered by a wearable battery, which may significantly restrict power and energy available for operation of a device for eliciting thermal sensations. Despite this limitation conventional approaches to generating thermal sensations are power intensive, and state-of-the-art solutions use large batteries or are limited in thermal sensation longevity. Another technical challenge is that the effectiveness of a haptic actuation may depend largely on the location(s) of application as well as the control of the actuator which may affect how the subjective sensation is perceived by a user.

In view of the above, the inventors have recognized that the use of either limited duration, bulky, and/or large power consumption heat transfer strategies have limited the use of thermal adjustment devices for various applications. The inventors have also recognized the benefits of improving longevity of thermal sensations (i.e., battery life for a wearable device) by modifying control schemes and the physical spacing for thermal pulses. Additionally, the inventors have recognized the specific benefits of heat flux through a heat transfer surface used to apply thermal sensations to a user. By carefully controlling heat flux through a heat transfer surface, a wearable heating and cooling device may improve battery life and elicit subjective thermal sensations while drawing a lower power consumption than conventional devices. In particular, the inventors have recognized the benefits of applying heating or cooling to a surface (e.g., skin) to elicit thermal sensations using spaced apart heat transfer elements or portions of a heat transfer surface.

According to exemplary embodiments described herein, the application of an adjustable, alternating thermal profile to the surface of human skin may interact with one or more physiological systems such that a physiological response is generated. For example, an adjustable alternating thermal profile may be used to modify one or more of vasoconstriction/vasodilation, respiration rate, heart rate, skin temperature, sweating, shivering, sympathetic response(s) (e.g., by the autonomic nervous system), perceived temperature on the skin, and/or thermal pleasure in a human subject (e.g., the user). Perceived temperature on the skin and thermal pleasure may be collectively referred herein as "subjective thermal sensations".

In some embodiments, a system for eliciting thermal sensations in a user includes applying a thermal profile that targets thermoreceptor density. Depending on the portion of the body, there may be a different distance between cold or hot thermoreceptors. Accordingly, in some embodiments, heat flux through a heat transfer surface may be controlled or altered to target average thermoreceptor spacing for a given body portion. For example, in some embodiments, a system may include a heat transfer surface that includes multiple thermoelectric modules spaced relative to one another. The spacing of the thermoelectric modules may be arranged to mirror an average thermoreceptor spacing for a given portion of the body (e.g., forearm). In another example, a heat transfer surface may include a plurality of active portions and an inner passive portion, where the active portions are similarly spaced to mirror thermoreceptor spacing in a body portion. According to both of these examples, the spacing of portions or modules that transfer heat from a heat transfer surface to skin may be referred to as "thermal pixels." As will be discussed further below, a thermal pixel configuration may allow for targeted heat flux to be applied to thermoreceptors in a given body portion, eliciting greater thermal sensations compared to existing devices and/or reducing power consumption or a given thermal sensation.

In view of the above, the inventors have appreciated the spacing values listed in the table below for applying thermal profiles for a given body portion may have enhanced thermal sensation and/or reduced power consumption relative to existing devices. According to exemplary embodiments described herein, a spacing between 2 mm and 20 mm, or a spacing between 2 mm and 9 mm elicit greater subject thermal sensations or more power efficient thermal sensations relative to existing devices. Of course, other ranges of spacing between thermal pixels may be employed, including a spacing greater than or equal to 3 mm, 5 mm, 7 mm, 9 mm, 10 mm, 12 mm, 15 mm, and/or another appropriate spacing. Correspondingly a spacing between thermal pixels may be less than or equal to 19 mm, 17 mm, 15 mm, 12 mm, 10 mm, 8 mm, 6 mm, and/or another appropriate spacing. Combinations of the above-noted ranges are contemplated, including a spacing between 3 mm and 15 mm, 3 mm and 17 mm, 4 mm and 15 mm, as well as 6 mm and 10 mm. Of course, different combinations of the above described spacing ranges are also contemplated as well as spacing amounts greater than and less than those noted above as the present disclosure is not so limited.

|  | AVG. DISTANCE BETWEEN THERMORECEPTORS (MM) | |
| --- | --- | --- |
|  | Cold | Warm |
| FOREHEAD | 3.9 | — |
| NOSE | 3.5 | 10.0 |
| LIPS | 2.4 | — |
| FACE (OTHER) | 3.4 | 7.7 |
| CHEST | 3.2 | 18.3 |
| ABDOMEN | 3.2 | — |
| BACK | 3.6 | — |
| UPPER ARM | 4.2 | — |
| FOREARM | 3.9 | 17.1 |
| BACK OF HAND | 3.7 | 14.1 |
| PALM OF HAND | 7.3 | 15.8 |
| FINGER DORSAL | 3.6 | 7.7 |
| FINGER VOLAR | 6.1 | 7.9 |
| THIGH | 4.6 | 15.8 |
| CALF | 4.5 | — |
| BACK OF FOOT | 4.2 | — |
| SOLE OF FOOT | 5.4 | — |

In some embodiments, a system for eliciting thermal sensations includes a heat transfer surface having an active portion and an inner passive portion. Together the active portion and inner passive portion form a total surface area of the heat transfer surface. As noted above, the density and spacing of thermoreceptors in a given body portion affects the thermal sensation elicited by a thermal profile applied by a heat transfer surface to the given body portion. Accordingly, in some embodiments, the active portion forms 40-90% of the total surface area of the heat transfer surface. Such a configuration may allow a thermal sensation to be elicited while applying heat flux through less than the full area of the heat transfer surface, a strategy that may reduce power consumption and/or increase heat flux through the active portions of the heat transfer surface. In some embodiments, the active portion may form 40-60% of the total surface area of the heat transfer surface. Of course, other percentages of the total surface area formed by the active portions are contemplated, including those greater than or equal to 30%, 45%, 50%, 55%, 60%, 70%, and/or another appropriate percentage. Correspondingly, percentages of the total surface area formed by the active portions may be less than or equal to 95%, 80%, 75%, 60%, 50%, 40%, and/or another appropriate percentage. Combinations of the above-noted ranges are also contemplated, including percentages between 50% and 70%, 30% and 70%, 45% and 80%, as well as 55% and 90%. Of course, different combinations of the above described percentage ranges are also contemplated as well as percentages greater than and less than those noted above as the present disclosure is not so limited.

As used herein, "total surface area" when used to define a ratio of active portion surface area to inner passive portion surface area may be defined by a region sharing boundaries with outermost edges of the active portions. That is, for the purposes of computing a percentage of active portion surface area compared with inner passive portion surface area, there is no passive surface area disposed along or outside of the outermost edges of the active surface area, such that inner passive surface area is only positioned between active portions of a heat transfer surface. For example, in embodiments where a heat transfer surface area is rectangular and there are four rectangular active portions in said heat transfer surface, the four heat transfer surfaces may each define a corner of the total surface area for the purposes of calculating percentage of active surface area (for example, see FIGS. 12-15).

In some embodiments, a system for applying thermal sensations may include generating heat flux through an active portion of a heat transfer surface. The inventors have appreciated that a rate of temperature change, or more specifically a flow of energy per unit of area and time affects the strength of subjective thermal sensations. That is, when sensed by a thermoreceptor, a thermal profile greater heat flux may subjectively feel more intense than a thermal profile with less heat flux. Accordingly, the inventors have appreciated that for a given amount of energy, greater heat fluxes may be generated by reducing the surface area through which the energy is applied to an abutting surface. According to exemplary embodiments described herein, the use of thermal pixels or active and passive regions of a heat transfer surface may allow for heat fluxes between 500 and 15,000 W/m² to be applied to an abutting surface during nominal operation of the device. In some embodiments, heat flux through an active portion of a heat transfer surface may be between 8,000 and 11,000 W/m² during nominal operation of the device. Of course, other heat fluxes generated through an active portion are contemplated, including heat fluxes greater than or equal to 500 W/m², 1,000 W/m², 2,000 W/m², 4,000 W/m², 6,000 W/m², 6,500 W/m², 7,000 W/m², 9,000 W/m², 10,000 W/m², and/or any other appropriate heat flux. Correspondingly, a heat flux through an active portion of the heat transfer surface may be less than or equal to 15,000 W/m², 14,000 W/m², 12,000 W/m², 10,000 W/m², 9,000 W/m², 8,000 W/m², 7000 W/m², 5,000 W/m² and/or any other appropriate heat flux. Combinations of the above-noted ranges are contemplated, including heat fluxes between 7,000 and 10,000 W/m², 8,000 and 10,000 W/m², as well as 9,000 and 11,000 W/m². Of course, different combinations of the above described heat flux ranges are also contemplated as well as heat fluxes greater than and less than those noted above as the present disclosure is not so limited.

In some embodiments, the heat flux across an active portion of a heat transfer surface may be different than a heat flux across a passive portion of the heat transfer surface. For example, in some embodiments a heat flux through the active portion may be in the same direction but greater than a heat flux through the passive portion by at least an order of magnitude. In some embodiments, a heat sink or thermal mass thermally coupled to the passive portion have a temperature opposite the temperature applied by the active portion. According to this embodiment, the heat flux through the active portion and passive portion may be opposite in direction. That is, when a cooling thermal profile is applied to a surface at the active portion (with negative heat flux as a result), the passive portion may have an elevated temperature relative to the surface (with positive heat flux as a result) Likewise, when a heating thermal profile is applied to a surface at the active portion (with positive heat flux as a result), the passive portion may have a lower temperature relative to the surface (with negative heat flux as a result). In this manner, the heat flux through the active portion and passive portion may be in opposite directions during nominal operation of a device including a heat transfer surface with an active portion and a passive portion. In some embodiments, the heat flux through a passive portion may be approximately zero while heat flux through an active portion is non-zero. Of course, any suitable heat flux may be applied though an active portion and a passive portion of a heat transfer surface to elicit subjective thermal sensations, including heat fluxes in the same direction or opposite directions, as the present disclosure is not so limited.

In some embodiments, a system for eliciting thermal sensations includes a heat transfer surface having an active portion and a passive portion. In some embodiments, the active portion may be defined by the presence of thermoelectric modules or thermoelectric piles. In some embodiments, the heat transfer surface may have a continuous heat transfer surface. In one such embodiment, one or more thermoelectric piles may be coupled to the continuous heat transfer surface. Where the thermoelectric piles are coupled to the heat transfer surface, that portion of the heat transfer surface may be deemed an "active portion," whereas portions of the heat transfer surface not coupled to a thermoelectric pile may be deemed a "passive portion." Alternatively, a plurality of thermoelectric piles may form a thermoelectric module having a spreader. The spreader may be in contact with or integrated into the heat transfer surface, forming an "active portion" of the heat transfer surface. In this embodiment, portions of the heat transfer surface not coupled to or in contact with the spreader may be a "passive portion" of the heat transfer surface. Accordingly, as used herein, "active portion" may refer to any portion of a heat transfer surface whereby positive or negative heat flux transferred to an adjacent surface, and the heat flux transferred by the active portion is greater than positive or negative heat flux transferred to a surface by the passive portion.

In some embodiments, active and passive portions of a heat transfer surface may be thermally isolated from one another and/or passive portions of the heat transfer surface. In one embodiment, an active portion may be raised relative to other portions of a heat transfer surface, so that there is an air gap between the active portions. In some embodiments, a passive portion of a heat transfer surface may have a lower thermal conductivity than the active portion(s) either disposed adjacent to and/or between one or more passive portions of a heat transfer surface. According to this embodiment, the active portion(s) may be raised relative to the passive portion or the passive portion may include an inner passive portion disposed between active portions. The active portion and passive portions may be formed of different materials and/or may have a thermally insulating barrier between the active and passive portions. Of course, any suitable thermally isolating coupling between active portions and passive portions of a heat transfer surface may be employed, as the present disclosure is not so limited.

The inventors have also recognized that the intensity of subjective thermal sensation may be related to a ratio of active portions surface area to total surface area of a heat transfer surface. In some embodiments, a system for eliciting thermal sensations on a wrist, or other portion of a body, of a user may have a heat transfer surface where an active portion of the heat transfer surface forms between 40-60% of the total surface area of the heat transfer surface. Such a range may be associated with subjectively more intense thermal sensations of heating or cooling. In some cases for thermal sensations applied to the wrist, a thermal sensation is subjectively less intense as the percentage of active portion is decreased below 40% toward 0% and is increased above 60% toward 100%.

While a heat transfer surface of exemplary embodiments described herein may apply sensations to any appropriately sized area, in one embodiment, the surface area of a heat transfer surface may be greater than or equal to 10 mm$^2$, 50 mm$^2$, 100 mm$^2$, 200 mm$^2$, 300 mm$^2$, 500 cm$^2$, 750 mm$^2$, 1000 mm$^2$, and/or any other appropriate surface area. Correspondingly, the surface area may be less than or equal to 1500 mm$^2$, 1250 mm$^2$, 1000 mm$^2$, 900 mm$^2$, 750 mm$^2$, 600 mm$^2$, 500 mm$^2$, and/or any other appropriate surface area. Combinations of the above noted ranges are contemplated, including, but not limited to, surface areas between or equal to 200 mm$^2$ and 1000 mm$^2$, 300 mm$^2$ and 900 mm$^2$, 500 mm$^2$ and 1500 mm$^2$, 50 mm$^2$ and 500 mm$^2$, 100 mm$^2$ and 750 mm$^2$, as well as 100 mm$^2$ and 1000 mm$^2$. Of course, different combinations of the above described surface area ranges are also contemplated as well as surface areas greater than and less than those noted above as the present disclosure is not so limited.

In some embodiments, a heat transfer surface may have a shape and/or layout configured to improve the intensity of thermal sensations generated by the heat transfer surface. For example, in some embodiments a heat transfer surface may have a square, rectangular, or circular shape, where active portions (e.g., thermal pixels) of the heat transfer surface are also rectangular shaped. In other embodiments, a heat transfer surface may be circular, and active portions may have an annular shape. In some embodiments the active portions may be spaced from one another, such that an inner passive portion of a heat transfer surface is positioned between the active portions. In some embodiments, the active portions may be surrounded by an outer passive portion of a heat transfer surface. According to such embodiments, for the purposes of calculating a ratio of active portion surface area to passive portion surface area, the area of the passive portion outside of the outermost edges of an active portions is ignored. That is, when calculating a ratio or percentage of active portion surface area relative to passive portion surface area, the area of inner passive portion(s) between the active portions is used, but the area of outer passive portion(s) is ignored. Of course, active and passive portions may take any suitable shape and may be disposed relative to one another in any desirable arrangement, as the present disclosure is not so limited.

Methods and devices for manipulating the temperature of a surface are generally provided. The present disclosure relates to a device that includes one or more heating and/or cooling elements, or other suitable thermal adjustment apparatus(es) (e.g., at least a thermoelectric material), placed near a surface, such as the skin of a user. The device may be configured to generate one or more (optionally alternating) thermal profiles at the surface, which may be accomplished by generating a series of thermal pulses and/or essentially continuous or semi-continuous thermal input, which may vary over time. Such thermal profiles, when suitably applied, may result in an enhanced thermal sensation for a user which, in some cases, may provide the user with a more pleasurable thermal experience than would otherwise be the case without the generation of the thermal profiles. Advantageously, in some embodiments, one or more properties of each thermal profile may be adjusted in order to provide continuous or semi-continuous enhanced thermal sensation to the user. As further described herein, an alternating thermal profile may include an average frequency, an oscillation window, and/or an average temperature, each of which may be adjustable. In some embodiments, the thermal profile (or one or more properties of the alternating thermal profile) may be adjusted in response to a signal sent to the device generated by a sensor and/or a user input.

Without wishing to be bound by theory, a person's perception of temperature is a complex interaction of both absolute temperature, temperature difference relative to current skin temperature, and a rate of change of the temperature applied to the person's skin. Accordingly, when applying a thermal profile to a user that is intended to apply a thermal sensation, the applied thermal profile may include temperatures and rates of temperature change as detailed below. In one embodiment, the temperature may be greater than or equal to 20° C., 25° C., 30° C., 31° C., 35° C. and/or any other appropriate temperature. Correspondingly, the applied temperature may be less than or equal to 45° C., 40° C., 36° C., 35° C., 33° C., and/or any other appropriate temperature. Combinations of the above noted ranges are contemplated including, for example, temperatures applied to a user that are between or equal to 20° C. and 45° C., 20° C. and 40° C., 30° C. and 36° C., as well as 31° C. and 35° C., with a temperature of 36° C. being preferable in some embodiments. These temperature ranges may be combined with rates of temperature change applied to a user's skin that are greater than or equal to 0.01° C./s (Celsius per second), 0.05° C./s, 0.1° C./s, 0.2° C./s, 0.5° C./s, 1° C./s, 1.5° C./s, 2.5° C./s, 5° C./s, 7.5° C./s, 10° C./s, and/or any other appropriate rate of temperature change. Applied rates of temperature change may also be less than or equal to 10° C./s, 7.5° C./s, 5° C./s, 2.0° C./s, 1.75° C./s, 1.25° C./s, 0.75° C./s, 0.3° C./s, 0.15° C./s, 0.075° C./s, and/or any other appropriate rate of temperature change. Combinations of these rates of temperature change are contemplated including, for example, a rate of temperature change between or equal to 0.01° C./s and 2.0° C./s, 0.05° C./s and 1° C./s, 0.1° C./s and 0.3° C./s, 0.01° C./s and 0.1° C./s, 0.1° C./s and 10° C./s, as well as 0.5° C./s and 2° C./s. Of course, different combinations of the above described temperature ranges and rates of temperature change, as well as ranges both greater than and less than those noted above, are also contemplated as the present disclosure is not so limited. Additionally, it should be noted that device according to exemplary embodiments described herein may be employed to raise the temperature of an abutting surface from an initial surface temperature (i.e., heat) or may be employed to lower the temperature of an abutting surface from the initial surface temperature (i.e., cool), as the present disclosure is not so limited. Further, the thermal profiles applied to a surface, such as a user's skin, during use may provide only cooling, only heating, or both heating and cooling as the disclosure is not limited to any particular thermal profile.

The above noted temperature changes may be applied cyclically to a user. Accordingly, in some embodiments, the individual warmth and cooling portions of a thermal profile may be applied for various durations. For example, the individual portions (e.g., thermal pulses) of a thermal profile may be applied for durations greater than or equal to 1 second, 2 seconds, 5 seconds, 10 seconds, 15 seconds, 30 seconds, 1 minute, 2 minutes, 5 minutes, and/or any other appropriate time period. Correspondingly, the individual portions of thermal profile may be applied for durations less than or equal to 10 minutes, 5 minutes, 2 minutes, 1 minute, 30 seconds, 15 seconds, 10 seconds, 5 seconds, 3 seconds and/or any other appropriate duration. Combinations of the above ranges are contemplated including, for example, durations for the individual thermal periods that are between or equal to 2 seconds and 15 seconds, 1 second and 5 seconds, 30 seconds and 2 minutes, 30 seconds and 10 minutes, 1 second and 10 seconds, and/or any other appropriate combination. Of course embodiments in which durations both greater than and less than those noted above are applied by a device for eliciting thermal sensations are also contemplated as the disclosure is not so limited.

The above noted rates of temperature change, as well as other rates of temperature change described herein, may either refer to an average rate of temperature change during a particular portion of a thermal profile when changing from a first temperature to a second temperature and/or they may refer to a temperature change rate that is applied during at least a portion of the applied thermal profile. For example, variable or constant temperature change rates may be applied when changing from a first temperature to a second temperature. Therefore, a particular rate may either be applied during at least a portion of the noted temperature change and/or the rate may correspond to an average rate during the noted temperature change.

In some embodiments, a device for eliciting thermal sensations provides energy-efficient generation of warming or cooling sensations in wearable form-factors using a low amount of power. Accordingly, when a device applies a desired thermal profile to an adjacent surface, the device may consume power during a warming or cooling portion of the thermal profile as detailed below. In one embodiment, the power consumed by applying a thermal profile during a warming or cooling portion of the thermal profile may be greater than or equal to 0.01 W, 0.05 W, 0.1 W, 0.2 W, 0.25 W, 0.5 W, 1 W, 2 W, 4 W, and/or are other appropriate power consumption. Correspondingly, the power consumed while applying a thermal profile may be less than or equal to 15 W, 10 W, 5 W, 3 W, 2 W, 1 W, 0.75 W, 0.5 W, and/or any other appropriate power consumption. Combinations of the above noted ranges are contemplated including, for example, power consumption that is between or equal to 0.1 W and 2 W, 0.1 W and 1 W, 1 W and 5 W, 1 W and 10 W, 0.5 W and 4 W, as well as 1 W and 5 W, with a power consumption of 5 W or less being preferable in some embodiments. Of course, any suitable amount of power may be consumed by a device for eliciting thermal sensations, including powers both greater than and less than those noted above, as the present disclosure is not so limited.

In some embodiments, a device for manipulating the temperature of the surface includes a heat transfer surface configured to be placed in contact with the surface. The heat transfer surface includes an active portion and an inner passive portion, where the active portion forms 40-90% of a total surface area of the heat transfer surface. The active portion of the heat transfer surface may be defined by the presence of a thermoelectric module in contact with or forming a part of the heat transfer surface. The device may also include a processor in electrical communication with the thermoelectric module(s) to control the thermoelectric module(s) to generate heat flux through the heat transfer surface (e.g., as a part of a thermal profile). The heat flux through the active portion of the heat transfer surface may be between 500 and 15,000 W/m$^2$. The inner passive portion may be formed of a different material than the active portion, may be thermally insulated from the active portion, or may otherwise have a heat flux less than that of the active portion during nominal operation of the device.

In some embodiments, a device for manipulating the temperature of the surface includes a heat transfer surface configured to be placed in contact with the surface. The heat transfer surface includes a plurality of active portions and an inner passive portion, where the active portions are spaces from adjacent active portions. The active portions have a first thermal conductivity, while the inner passive portion has a second, lower thermal conductivity. The inner passive portion is disposed between each of the active portions. The active portions may each be formed by one or more thermoelectric modules or piles or may otherwise be thermally connected to a thermoelectric module or other thermal adjustment apparatus. The device may also include a processor in electrical communication with the thermoelectric modules to control the thermoelectric modules to generate heat flux through the heat transfer surface (e.g., as a part of a thermal profile).

In some embodiments, a method of eliciting a thermal sensation includes placing a plurality of active portions of a heat transfer surface in contact with user's skin. Each of the active portions may be formed by at least one thermoelectric module. The active portions may be spaced from adjacent active portions by 2 to 20 mm. The method may also include applying at least one thermal pulse at each of the plurality of active portions with the thermoelectric modules. The thermal pulse may include a heating thermal profile and/or a cooling thermal profile. In some embodiments, the method includes applying a plurality of thermal pulses in succession.

In some embodiments, a device or system for eliciting subjective thermal sensations may be suitable for integration with other wearable technologies, other forms of sensory actuation, and/or with larger more complex systems through wired and/or wireless communication. In some embodiments, device of exemplary embodiments described herein may be incorporated into a wearable article (e.g., an article of clothing). For example, in certain embodiments, a device as described herein may be incorporated in a scarf, necklace, armband, wristband, hat, shirt, vest, pants, leggings, sleeves, headphones, ear buds, eyeglasses, goggles, or any other suitable wearable article capable of being worn on any appropriate portion of a person's body. The size of the device may be selected, in some embodiments, such that the device fits comfortably on or around a wrist, an ankle, a head, a neck, a torso, an arm, a leg, a calf, an ear, a face and/or any other appropriate portion of a person's body. In some embodiments, a device according to exemplary embodiments described herein may be incorporated into a smart watch. Additionally, embodiments in which a thermal device is not incorporated into a wearable article are also contemplated. For example, a thermal device may configured such that it may be applied manually by a person and/or may be incorporated into a separate stationary system.

Accordingly, it should be understood that the currently disclosed thermal devices are not limited to any particular form factor and/or size.

According to exemplary embodiments described herein, the term "thermoelectric" is given its ordinary meaning in the art and refers to materials in which a temperature change is generated at a surface of the material upon application of an electric potential (e.g., voltage and corresponding current), in accordance with the thermoelectric effect (e.g., often referred to by other names such as the Peltier, Thomson, and Seebeck effects). Any suitable thermoelectric may be employed, a number of which are described further below. It should be understood that, while a portion of the description herein describes thermoelectric materials, the present disclosure is not limited to thermoelectric materials, and other thermal adjustment apparatuses may be employed where appropriate. For example, it can be appreciated that any suitable heating and/or cooling element may be employed; for example, a resistive heating device, convective thermal device, radiative thermal device, or any other suitable apparatus that is capable of generating a desired warming and/or cooling thermal sensation may be used.

Turning to the figures, specific non-limiting embodiments are described in further detail. It should be understood that the various systems, components, features, and methods described relative to these embodiments may be used either individually and/or in any desired combination as the disclosure is not limited to only the specific embodiments described herein.

FIG. 1 is a side schematic view of one embodiment of a device 100 for manipulating temperature. The device 100 of FIG. 1 includes a body 102 including a heat transfer surface 104. Raised from the heat transfer surface are two active portions 106. According to the embodiment of FIG. 1, the active portions 106 are in thermal communication with thermoelectric modules 107. As shown in FIG. 1, the active portions have a width A, and are spaced apart from one another by a distance B. In some embodiments, the distance B is between 2 mm and 20 mm. In some embodiments, the distance B is between 2 and 9 mm. According to the embodiment of FIG. 1, the width A of the active portions is less than the distance B of the space of the heat transfer surface 104 between the active portions. As shown in FIG. 1, the active portions 106 are raised relative to the heat transfer surface 104. Accordingly, the portions of the heat transfer surface not covered by the active portions are a passive portion including an inner passive portion 105 and an outer passive portion 109 (see FIG. 2) of the heat transfer surface. In the embodiment of FIG. 1, the active portions 106 are separated by an air gap. In some embodiments, the active portions 106 may be formed of a different material than the passive portion, such that the passive portion thermally isolates the active portions. For example, a passive portion of a surface or device located between two active portions may be have a thermal conductivity sufficiently large compared to the active portions that it may be considered thermally insulating.

According to the embodiment of FIG. 1, the device 100 includes a processor 108 configured to control the heat transfer surface 104, and in particular the active portions 106, to apply one or more thermal pulses, or other desired thermal profile, to an abutting surface (e.g., skin of a user). In particular, the processor 108 is configured to execute a series of computer readable instructions stored in memory. The processor 108 is in communication with the thermoelectric modules 107 in thermal communication with the active portions 106, and may transmit signals to the thermoelectric modules to apply a heating or cooling thermal pulse at the active portions. The device also includes a power source 110 and a sensor 112 connected to the processor. The sensor 112 may be a temperature sensor, accelerometer, gyroscope, position sensor, physiological sensor, or any other suitable sensor that may be used to provide the processor 108 additional information for controlling operation of the heat transfer surface. The processor 108 may be configured to control a current, or other operating parameter, applied to the thermoelectric modules 107 of the heat transfer surface 104 to generate a desired thermal profile. The processor may use information provided by the sensor 112 for feedback control of the thermoelectric modules to generate a desired thermal profile at the active portions 106. The power source 110 may be a battery or any other appropriate form of portable power capable of supplying electrical power to the processor, sensors, and heat transfer surface.

According to the embodiment of FIG. 1, the device 100 includes multiple thermoelectric modules 107 in direct thermal communication with the active portions 106. However, in other embodiments one or more thermoelectric modules may be spaced from the active portions 106 and thermally coupled to the active portions with a thermally conductive material. In some embodiments, heat pipes or other thermally conductive structures may be used the thermally couple the thermoelectric modules 107 to the active portions 106. As noted previously, in some embodiments a thermoelectric module may be integrated into an active portion, or form the active portion itself. Of course, while thermoelectric modules are employed in the embodiment of FIG. 1, in other embodiments a device for manipulating the temperature of a surface may employ other thermal adjustment apparatuses, including, but not limited to, a resistive heating device, convective thermal device, radiative thermal device, or any other suitable apparatus that is capable of generating a desired warming and/or cooling thermal sensation.

Figure 2:
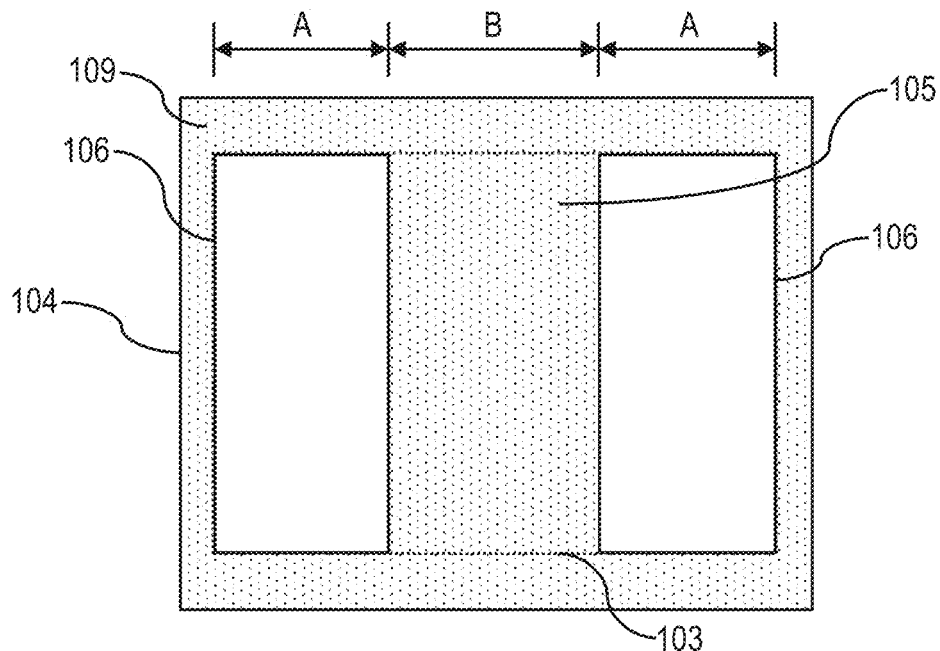
FIG. 2 is top schematic view of the device of FIG. 1.

FIG. 2 is top schematic view of the device for manipulating temperature of FIG. 1, showing the spacing between the active portions 106. As noted previously, the active portions 106 do not form the entire heat transfer surface 104. That is, the active portions 106 may be considered thermal pixels, where the thermal pixels are spaced apart by the distance B. According to the embodiment shown in FIG. 2, the inner passive portion 105 of the heat transfer surface is disposed between the active portions 106 when viewed from the top. That is, the inner passive portion 105 of the heat transfer surface occupies the lateral space between the active portions, while the active portions 106 are separated from one another by an air gap (see FIG. 1). In the embodiment of FIG. 2, the distance B may be between 2 and 20 mm, or alternatively between 2 and 9 mm. Additionally, the active portions 106 together form approximately 60% of the total surface area 103 of the heat transfer surface, where the total surface area includes the active portions 106 and inner passive portion 105, but not the outer passive portion 109.

Figure 3:
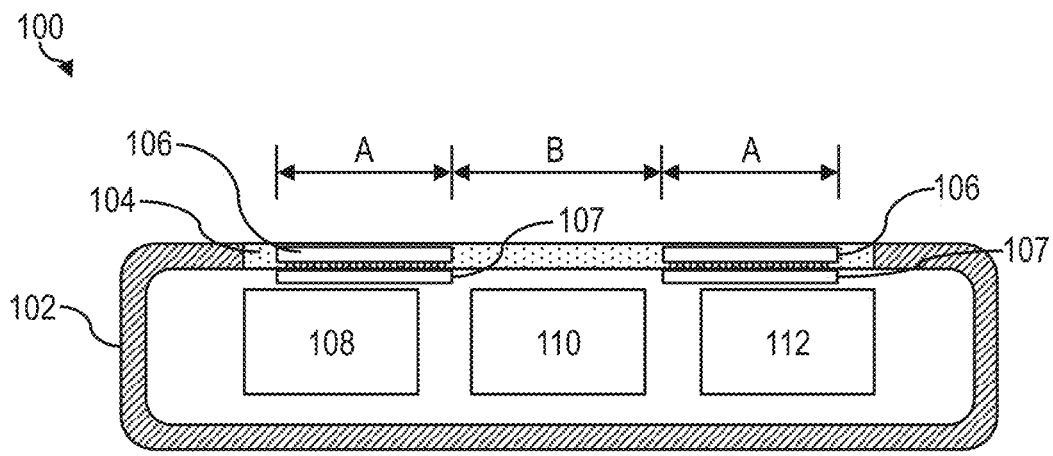
FIG. 3 is a side schematic view of one embodiment of a device for manipulating temperature.
Figure 4:
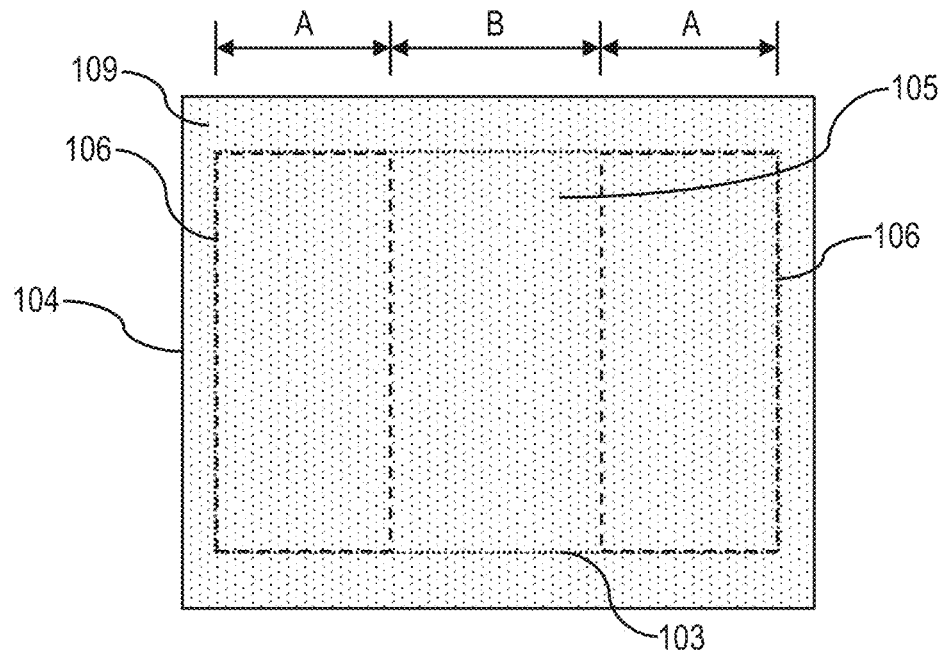
FIG. 4 is top schematic view of the device of FIG. 2.

FIG. 3 is a top schematic view and FIG. 4 is a top schematic view of another embodiment of a device 100 for manipulating temperature. The embodiment of FIGS. 3-4 is similar to that of FIGS. 1-2, and the device includes a body 102 having a heat transfer surface 104 with active portions 106. Unlike the device of FIGS. 1-2, the active portions 106 are integrated into the heat transfer surface 104. That is, the active portions are not raised, such that the heat transfer surface has a continuous surface for placing in contact with a surface. The active portions 106 are each in thermal communication with separate thermoelectric modules 107.

That is, the thermoelectric modules 107 are thermally connected to the active portions 106 via a thermally conductive material. In some embodiments, the active portions may each be defined by a plurality of thermoelectric piles disposed in the heat transfer surface 104. However, other heating and/or cooling thermal adjustment apparatuses may be used in these active portions, as previously discussed. Like the embodiment of FIGS. 1-2, the portion of the heat transfer surface 104 not defined by the presence of the active portions 106 is a passive portion including an inner passive portion 105 and an outer passive portion 109. The inner passive portion 105 of the embodiment of FIGS. 3-4 is disposed between the active portions 106. In some embodiments, the passive portion may be formed of a different material from the active portions, so that the active portions 106 are thermally isolated from one another. Such an arrangement may yield a greater heat flux through the active portions during nominal operation of the device than heat flux through the passive portion. In some embodiments, the active portions 106 and passive portion of a heat transfer surface may be formed separately. In such an embodiment, the active portions may be flush with the passive portion, so that a heat transfer has a substantially planar surface for contacting an adjacent surface (e.g., a user's skin).

According to the embodiment of FIGS. 3-4, the active portions have a width A and are spaced apart from one another by a distance B. The distance B may be between 2 mm and 20 mm in some embodiments, while in other embodiments the distance B may be between 2 and 9 mm. The active portions 106 may form between 40 and 65% of the total surface area 103 of the heat transfer surface 104, where the total surface area includes the active portions 106 and inner passive portion 105, but not the outer passive portion 109.

As shown in FIG. 3, the device 100 includes a processor 108 configured to control the heat transfer surface 104, and in particular the active portions 106, to apply one or more thermal pulses, or other desired thermal profile, to an abutting surface (e.g., skin of a user). The device also includes a power source 110 and a sensor 112 connected to the processor. The sensor 112 may be a temperature sensor, accelerometer, gyroscope, position sensor, physiological sensor, or any other suitable sensor that may be used to provide the processor 108 additional information for controlling operation of the heat transfer surface. The processor 108 may be configured to control a voltage applied to the active portions of the heat transfer surface 104 to generate a desired thermal profile. The processor may use information provided by the sensor 112 for feedback control of the active portions to generate a desired thermal profile. The power source 110 may be a battery or any other appropriate form of portable power capable of supplying electrical power to the processor, sensors, and heat transfer surface.

According to the embodiments of FIGS. 1-4, the devices may be configured to generate a heat flux through the heat transfer surface 104 to apply a thermal profile including one or more thermal pulses to an adjacent surface like the skin of a user. That is, the devices of FIGS. 1-4 may be employed to elicit thermal sensations of heating or cooling for a user. In some embodiments, the devices may be wearable an integrated into a suitable wearable article, for example, like a wristband. During the application of a thermal profile, the active portions of the heat transfer surface may provide a heat flux between 500 and 15,000 W/m$^2$ to an abutting surface during nominal operation of the device. In some embodiments, heat flux through an active portion of a heat transfer surface may be between 8,000 and 11,000 W/m$^2$ during nominal operation of the device. In some embodiments, the heat flux applied through an active portion of a heat transfer surface may be opposite a heat flux through an inner passive portion 105 and outer passive portion 109 of the heat transfer surface. That is, the inner passive portion and outer passive portion of the heat transfer surface may provide a heat flux to an abutting surface (e.g., a user's skin) in an opposite direction relative to the heat flux through the active portions. Of course, other heat fluxes generated through an active portion are contemplated, and the present disclosure is not limited in this regard.

Figure 5:
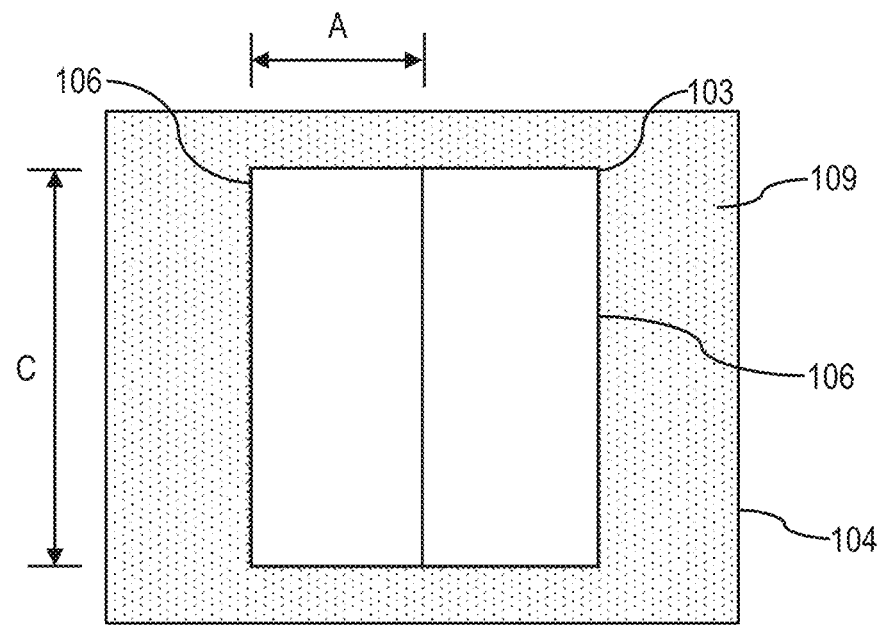
FIG. 5 is a top schematic view of another embodiment of a device for manipulating temperature.
Figure 6:
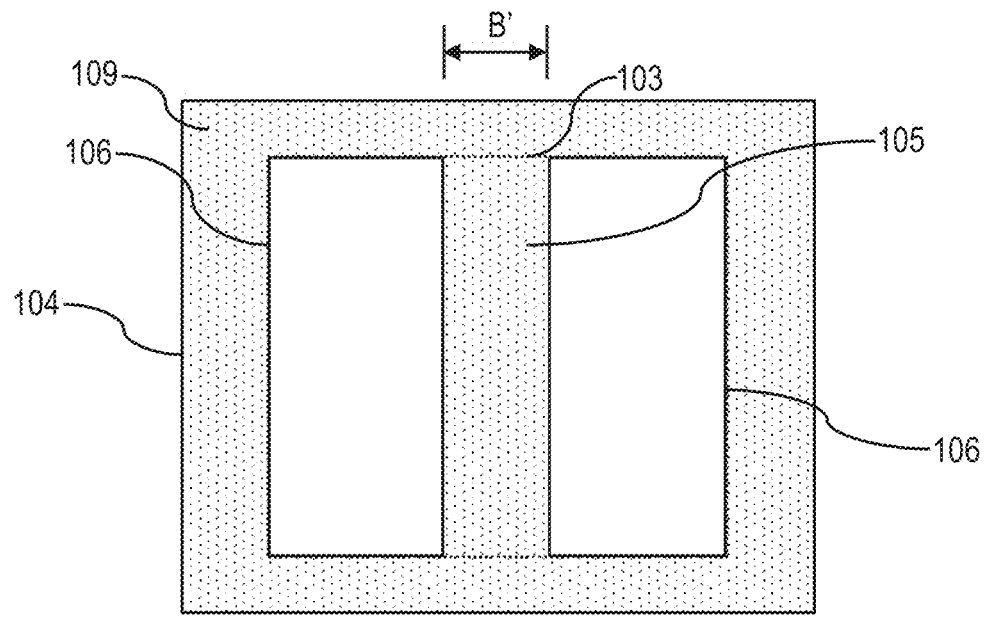
FIG. 6 is a top schematic view of yet another embodiment of a device for manipulating temperature.

FIGS. 5-6 are top schematic views showing additional embodiments of a device for manipulating temperature where active portions 106 are varied in spacing relative to one another and a passive portion of a heat transfer surface 104. As shown in FIG. 5, the heat transfer surface 104 includes two abutting active portions 106 and an outer passive portion 109 surrounding the active portions. The passive portion of FIG. 5 does not include an inner passive portion. According to the embodiment of FIG. 5, the active portions are abutting, and may effectively function as a single active portion. The active portions 106 of FIG. 5 have a width A and a length C. The length C is greater than the width A, such that the active portions 106 have a rectangular shape. According to the embodiment of FIG. 5, the active portions 106 make up 100% of the total surface area 103 of the heat transfer surface 104, as the area of the outer passive portion 109 outside of the outermost edges of the active portions 106 is ignored. According to the embodiment of FIG. 6, the active portions 106 make up between 40-75% of the total surface area 103 of the heat transfer surface 104. The total surface area of the heat transfer surface 104 of the embodiment of FIG. 5 may be between 200 and 1000 mm$^2$.

According to the embodiment of FIG. 6, a spacing distance B' between the two active portions 106 is increased relative to the embodiment of FIG. 5. Accordingly, in the embodiment of FIG. 6, the passive portion of the heat transfer surface 104 includes an inner passive portion 105 and an outer passive portion 109. The spacing distance B' may be adjusted to any suitable value to target hot and/or cold thermoreceptor spacing on a particular body portion. That is, for a given device, two or more active portions may be spaced a suitable distance corresponding to density or spacing of thermoreceptors in the body, such that a thermal profile is in an effective matrix without applying the thermal profile across an entire surface area to reduce power consumption. In some embodiments, the distance B' may be between 2 mm and 20 mm, or between 2 mm and 9 mm. Of course, other ranges of spacing between the active portions may be employed, including a spacing greater than or equal to 3 mm, 5 mm, 7 mm, 9 mm, 10 mm, 12 mm, 15 mm, and/or another appropriate spacing. Correspondingly a spacing between thermal pixels may be less than or equal to 19 mm, 17 mm, 15 mm, 12 mm, 10 mm, 8 mm, 6 mm, and/or another appropriate spacing. Combinations of the above-noted ranges are contemplated, including a spacing between 3 mm and 15 mm, 3 mm and 17 mm, 4 mm and 15 mm, as well as 6 mm and 10 mm. Such arrangements may allow heat fluxes between 500 and 15,000 W/m$^2$ to be applied through the active portions 106.

Figure 7:
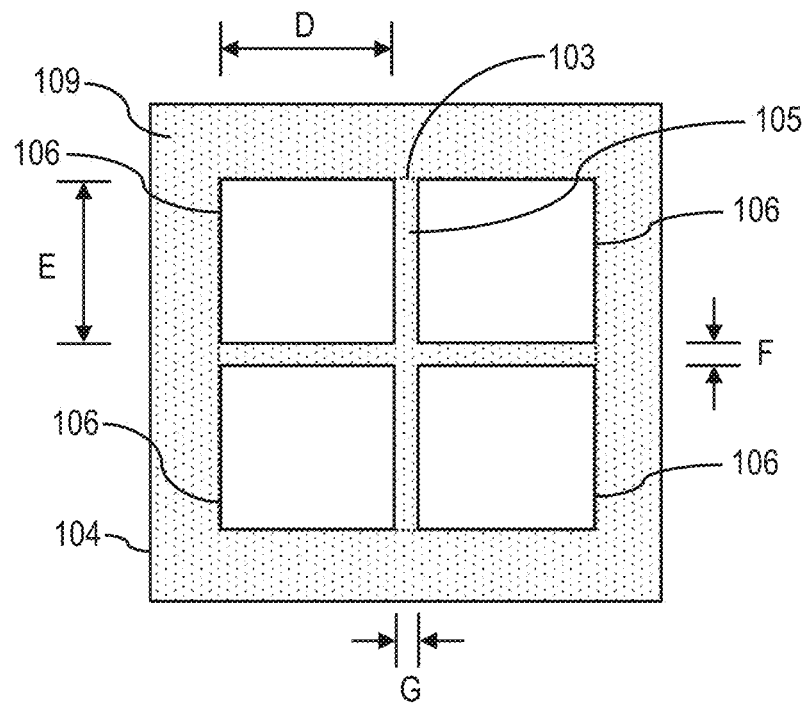
FIG. 7 is a top schematic view of yet another embodiment of a device for manipulating temperature.
Figure 8:
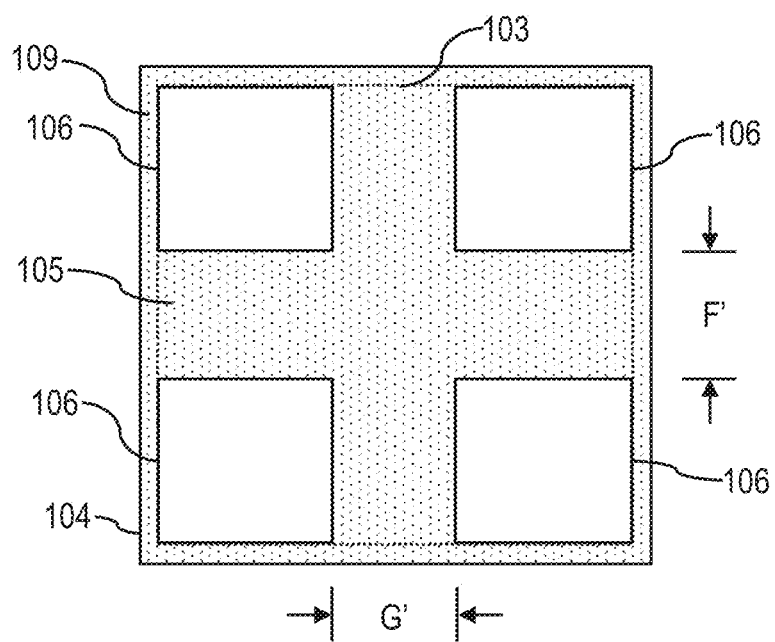
FIG. 8 is a top schematic view of yet another embodiment of a device for manipulating temperature.

FIGS. 7-8 are top schematic views of alternative embodiments of a device for manipulating temperature including a heat transfer surface 104. As shown in FIG. 7, the heat transfer surface 104 includes four active portions 106 spaced from one another by distances F and G. Each of the active portions 106 has a width D and a length E. The width D and length E are approximately equal to one another, such that the active portions are square in shape. The active portions 106 are surrounded by an outer passive portion 109. An inner passive portion 105 is disposed between the active portions, occupying the distances F and G. The distances F and G may be equal to one another, and may be between 2 mm and 20 mm. The active portions may be defined by one or more thermoelectric modules each. In some embodiments, the active portions may be defined by the presence of a plurality of thermoelectric piles. The active portions together form an array or matrix of thermal pixels. In the embodiment of FIG. 8, the distances F and G are increased to distances F' and G' respectively. Accordingly, the distances F and G may be modified to any suitable spacing corresponding to thermoreceptor spacing of a body portion on which the device may be used to apply a thermal profile. In both the embodiments of FIG. 7, the active portions 106 may form approximately 86% of the total surface area 103 of the heat transfer surface. In the embodiment of FIG. 8, the active portions 106 may form approximately 52% of the total surface area 103 of the heat transfer surface. The total surface area 103 of the heat transfer surface 104 of both the embodiments of FIGS. 7-8 may be between 200 and 1000 mm².

Figure 9:
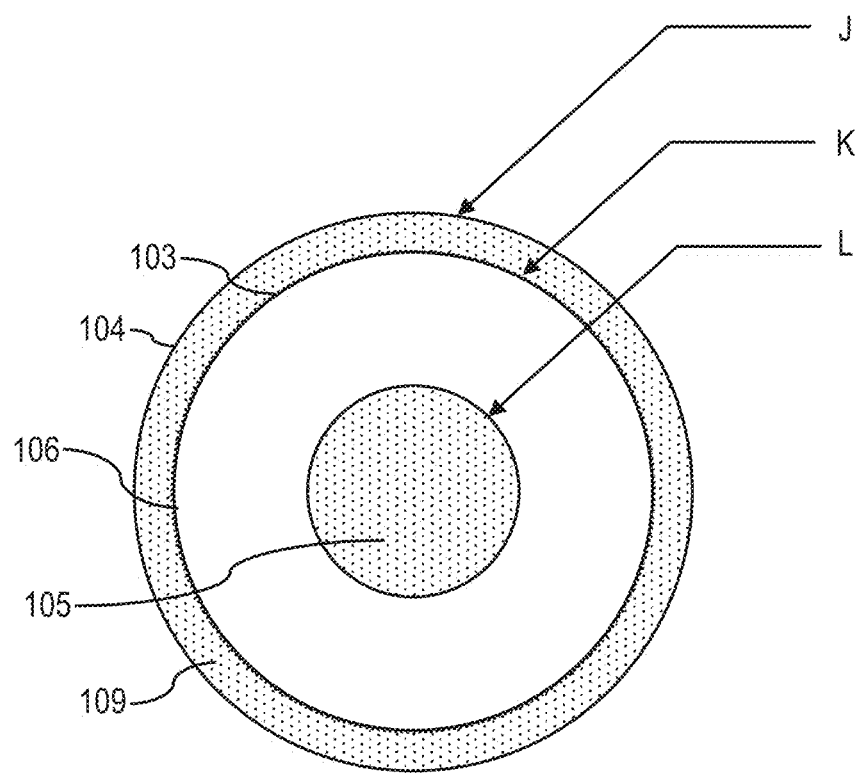
FIG. 9 is a top schematic view of yet another embodiment of a device for manipulating temperature.

FIG. 9 is a top schematic view of yet another embodiment of a device for manipulating temperature. As shown in FIG. 9, the device includes a circular heat transfer surface 104 including an annular active portion 106. Similar to other embodiments described herein, the active portion 106 may be formed of one or more thermoelectric modules, or alternatively a plurality of thermoelectric piles. A passive portion of the heat transfer surface 104 including an inner passive portion 105 and an outer passive portion 109 may lack a thermal connection to thermoelectric modules or thermoelectric piles. Of course, while thermoelectric modules or piles may be employed in the embodiment of FIG. 9, other suitable arrangements including a resistive heating device, convective thermal device, radiative thermal device, or any other suitable apparatus that is capable of generating a desired warming and/or cooling thermal sensation may be employed, and the present disclosure is not so limited in this regard. According to the embodiment of FIG. 9, the inner passive portion 105 is disposed inside of the active portion 106. The outer passive portion 109 laterally surrounds the active portion 106. The active portion has an inner diameter of L and an outer diameter of K, while the inner passive portion 105 has a diameter of L. The device has a total diameter of J. According to the embodiment of FIG. 9, the annular active portion forms approximately 80% of the total surface area 103 of the heat transfer surface, where the total surface area 103 includes the active portion 106 and the inner passive portion 105, but not the outer passive portion 109.

As noted above, the arrangement shown in FIG. 9 includes an annular active portion 106 with an inner passive portion 105 and surrounded by an outer passive portion 109. In some embodiments, the inner passive portion 105 and outer passive portion 109 may be formed of a material having a thermal conductivity lower than that of the active portion. Accordingly, the inner passive portion 105 and outer passive portion 109 may function to thermally isolate the active portion 106 and an associated heating and/or cooling apparatus from other components of the device. In some embodiments, multiple annular active portions may be employed in a device for manipulating the temperature of a surface. The multiple annular active portions may be spaced from one another by the inner passive portion 105. Accordingly, in some embodiments, a device may have a circular heat transfer surface having alternating annular passive and active portions of different diameters.

Figure 10:
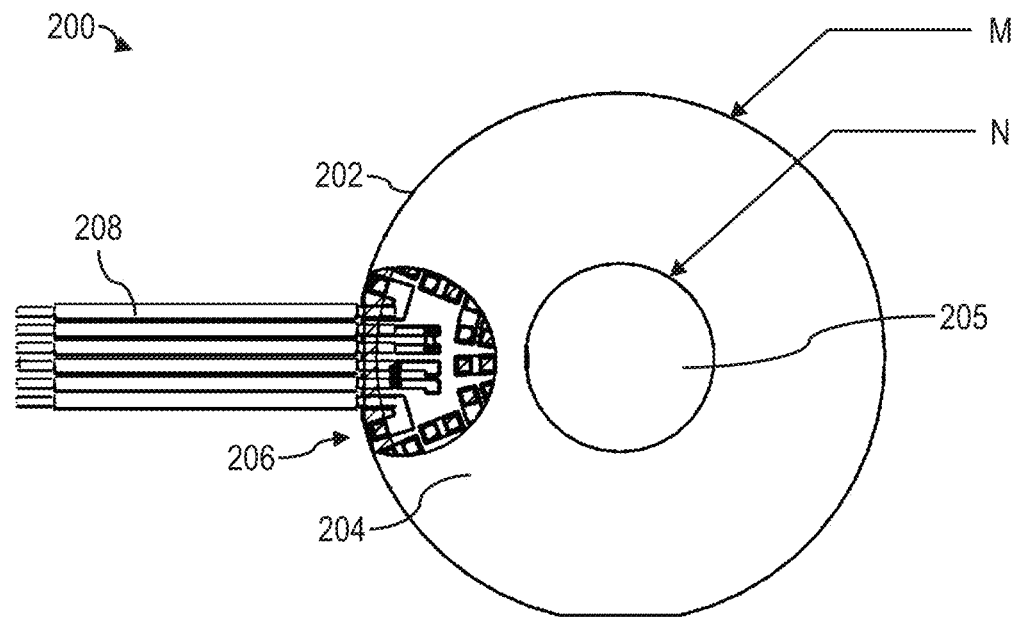
FIG. 10 is a top view of yet another embodiment of a device for manipulating temperature.
Figure 11:
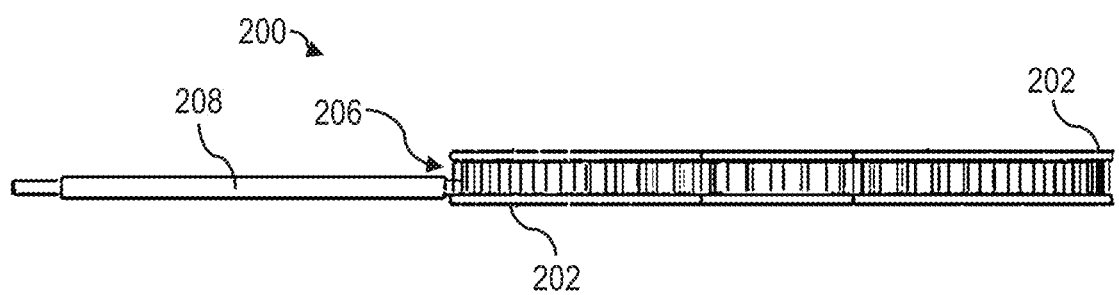
FIG. 11 is a side view of the device of FIG. 10.
Figure 12:
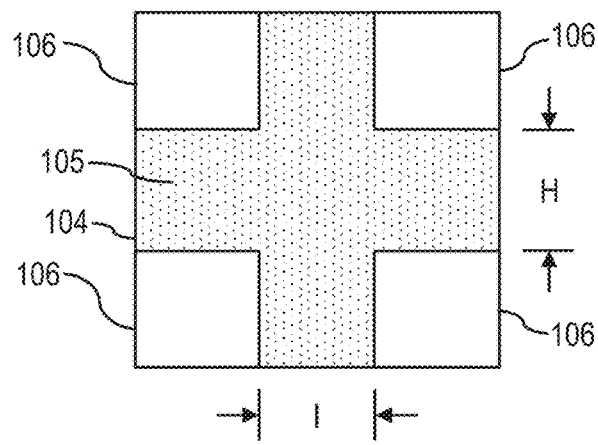
FIG. 12 is a top schematic view of an exemplary experimental device for manipulating temperature.
Figure 13:
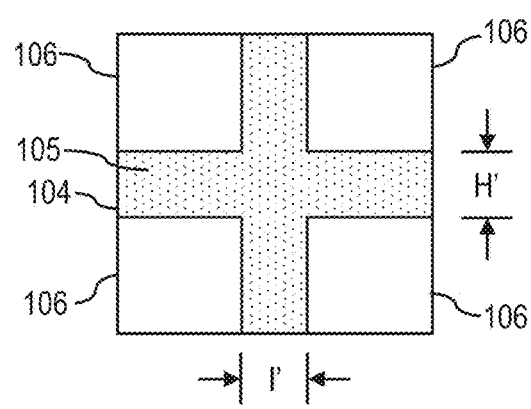
FIG. 13 is a top schematic view of another exemplary experimental device for manipulating temperature.
Figure 14:
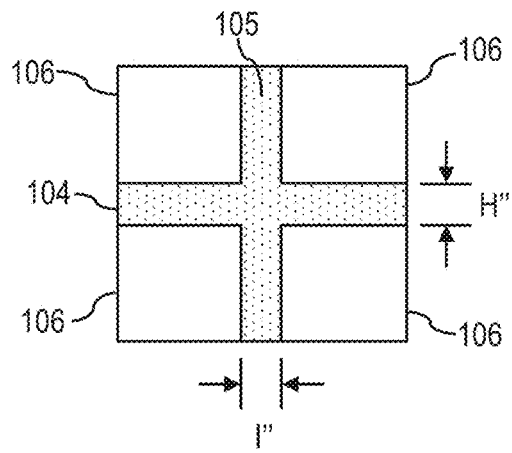
FIG. 14 is a top schematic view of another exemplary experimental device for manipulating temperature.
Figure 15:
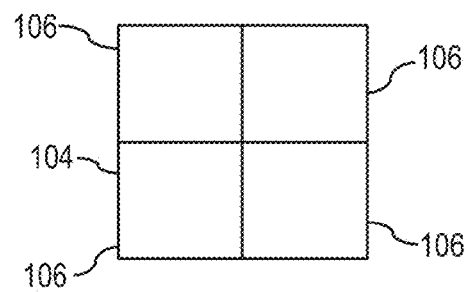
FIG. 15 is a top schematic view of another exemplary experimental device for manipulating temperature.

FIG. 10 is a top view and FIG. 11 is a side view, respectively, of another embodiment of a device 200 for manipulating temperature. As shown in FIGS. 10-11, the device 200 includes top and bottom heat transfer surfaces 202 including an annular active portion 204 and a circular inner passive portion 205. The active portion of the heat transfer surfaces is formed by a plurality of thermoelectric piles 206, which extend between the active portions and are configured to apply a thermal profile based on a voltage applied across the thermoelectric piles. As shown in FIGS. 10-11, cables 208 extend from the thermoelectric piles 206 that may be used to apply a voltage across the piles to generate a thermal profile. The cables 208 may be connected to a processor configured to control the thermoelectric piles to generate a thermal profile at one of the two heat transfer surfaces. According to the embodiment of FIGS. 10-11, the active portion 204 forms a radially outermost portion of the heat transfer surfaces 202. The active portion 204 makes up approximately 85% of the total surface area of the heat transfer surface area.

Examples

To validate the efficacy of the benefits describe herein, the inventors undertook experiments to evaluate the subjective effects of the percentage active area relative to the total area of a heat transfer surface. For the experiment, a two by two array of active portions was employed as shown in FIGS. 12-15. As shown in FIGS. 12-15, the devices each included a heat transfer surface 104 having a plurality of active portions 106. In particular, each device of FIGS. 12-15 included active portions 106 forming a least a portion of an outer perimeter of the heat transfer surface 104. The difference between each of the devices of FIGS. 12-15 was spacing between each of the active portions and the percentage of total surface area of the heat transfer surface made up by the active portions. The active portions were formed by one or more thermoelectric modules. Alternatively, it is noted that the active portions could have been formed by a plurality of thermoelectric piles. For the device of FIG. 12, the active portions 106 were spaced from one another by distances H and I. H and I were approximately equal to one another, and were about 15 mm. An inner passive portion 105 of the heat transfer surface was disposed between each of the active portions. According to the device of FIG. 12 the active portions formed approximately 45% of the total surface area of the heat transfer surface. According to the device of FIG. 13, the spacing distances H' and I' were reduced relative to FIG. 12 to about 8 mm. The active portions 106 formed approximately 62% of the total surface area of the heat transfer surface. According to the device of FIG. 14, the spacing distances H" and I" were reduced relative to FIG. 13 to about 5 mm. Correspondingly, the active portions 106 formed approximately 74% of the total surface area of the heat transfer surface 104. Finally, in FIG. 15, the spacing between the active portions 106 was eliminated (i.e., the distance was 0 mm), and the active portions formed 100% of the heat transfer surface.

It should be noted that while the exemplary devices of FIGS. 12-15 had four active portions arranged in a two by two array, the inventors have appreciated that any suitable number of active portions in an array could have been employed. For example, some devices may employ nine active portions in a three by three array, or some device may employ sixteen active portions in a four by four array.

Furthermore, the inventors have appreciated that a plurality of active portions may not be arranged in a grid array, and may instead be arranged in any suitable pattern.

In the experiment, as shown in FIGS. 12-15, the ratio of the active portion surface area and total surface area was varied between 0.1 (i.e., 10% active portion area) and 1 (i.e., 100% active portion area). For each of the surface areas, the devices for manipulating temperature were used to apply a heating or cooling profile to the wrist of a subject. In each configuration, the thermal profile was applied in 6 second intervals with a 2 second rest period with constant voltage and an energy input of 1 W. For each configuration, the subject rated the sensations on a Likert scale for intensity. Each active portion configuration was tested three times.

Figure 16:
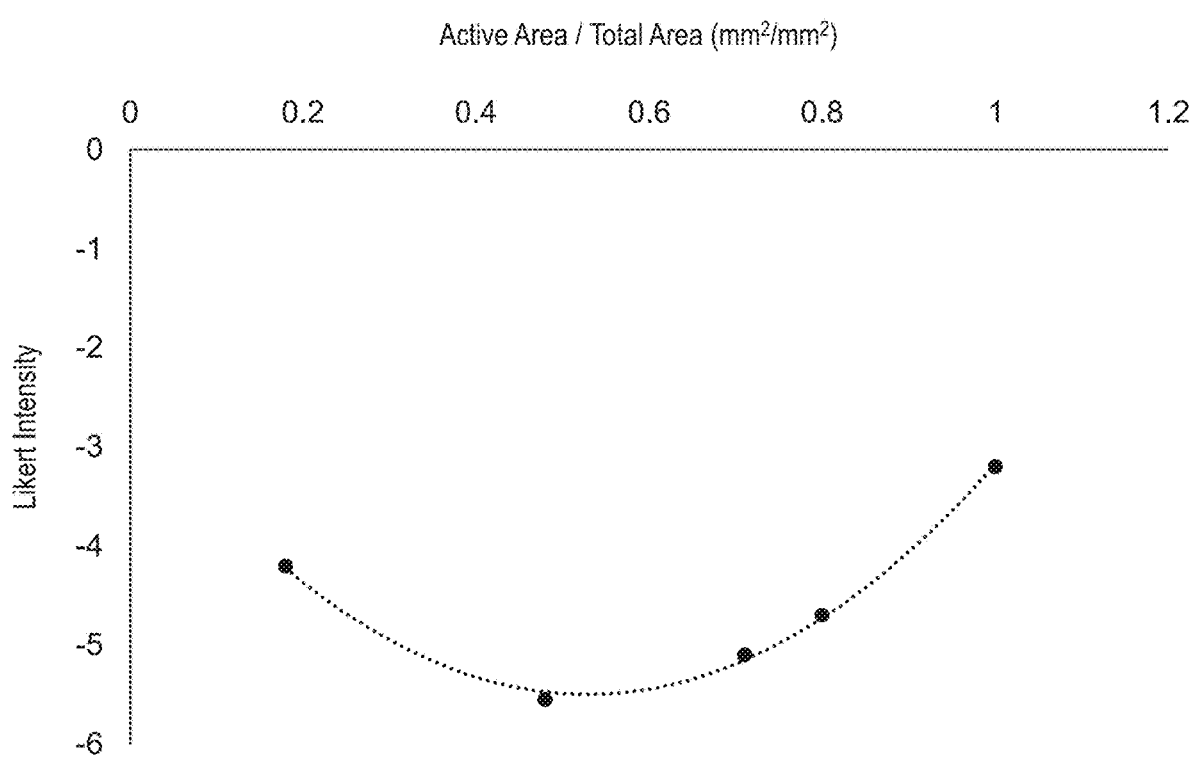
FIG. 16 is a graph depicting an experimental relationship between active thermoelectric area divided by total thermoelectric area and perceived intensity.

FIG. 16 is a graph depicting the results of the experiment evaluating the relationship between active thermoelectric area divided by total thermoelectric area and perceived intensity. On the X-axis, the ratio of active area divided by total area is shown. On the Y-axis, the subjective intensity of the thermal pulses is shown on a Likert scale, with a more negative Likert intensity corresponding to greater intensity. The graph is shown with a poly fit, showing that the greatest Likert intensity lies approximately between the ratios of 0.4 and 0.6. Accordingly, heat transfer surfaces where the active portion forms between 40% and 60% of the total area of the heat transfer surface may be perceived as more intense for the same total energy input to the device. As a result, compared to existing devices, in some embodiments the power consumption may be reduced to maintain a given thermal intensity, thereby preserving battery life for a device for manipulating temperature.

The above-described embodiments of the technology described herein can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component, including commercially available integrated circuit components known in the art by names such as CPU chips, GPU chips, microprocessor, microprocessor, or co-processor. Alternatively, a processor may be implemented in custom circuitry, such as an ASIC, or semicustom circuitry resulting from configuring a programmable logic device. As yet a further alternative, a processor may be a portion of a larger circuit or semiconductor device, whether commercially available, semi-custom or custom. As a specific example, some commercially available microprocessors have multiple cores such that one or a subset of those cores may constitute a processor. Though, a processor may be implemented using circuitry in any suitable format.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present disclosure may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the embodiments described herein may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Further, some actions are described as taken by a "user." It should be appreciated that a "user" need not be a single individual, and that in some embodiments, actions attributable to a "user" may be performed by a team of individuals and/or an individual in combination with computer-assisted tools or other mechanisms.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art. Accordingly, the foregoing description and drawings are by way of example only.

What is claimed is:

1. A wearable device for manipulating a temperature of a surface, comprising:

a heat transfer surface configured to be placed in contact with the surface, wherein the surface is a user's skin, and the heat transfer surface comprising:
- an active portion defined by a single thermoelectric module, wherein the active portion has a first thermal conductivity, and
- an inner passive portion wherein a perimeter of the inner passive portion is fully surrounded by the active portion and wherein the inner passive portion has a second thermal conductivity less than the first thermal conductivity wherein the perimeter of the active portion is fully surrounded by an outer passive portion.

2. The device of claim 1, further comprising a heat sink thermally coupled to the inner passive portion, and wherein a heat flux through the active portion is in an opposite direction relative to a heat flux through the inner passive portion during operation of the device.

3. The device of claim 1, wherein the active portion forms 40-60% of a total surface area of the heat transfer surface.

4. The device of claim 1, wherein the heat transfer surface has a power consumption between 0.1 and 2 W during operation of the device.

5. The device of claim 1, wherein a heat flux through the active portion is between 8,000 and 11,000 W/m$^2$ during operation of the device.

6. The device of claim 1, wherein a total surface area of the heat transfer surface is between 200 and 1000 mm$^2$ during operation of the device.

7. The device of claim 1, wherein the thermoelectric module is rectangular.

8. The device of claim 1, wherein the thermoelectric module is annular.

9. The device of claim 1, wherein a heat flux through the active portion is between 500 and 15,000 W/m$^2$ during operation of the device.

10. The device of claim 1, wherein the heat transfer surface has a plurality of active portions.

11. The device of claim 1, further comprising a spreader configured to transfer heat and thermally coupled with the thermoelectric module.

12. The device of claim 11, wherein the inner passive portion is thermally isolated from the spreader.

13. The device of claim 1, wherein the thermoelectric module includes a plurality of thermoelectric piles.

14. The device of claim 1, wherein a boundary of a total surface area is defined by a region sharing a boundary with outer edges of the thermoelectric module.

15. The device of claim 1, wherein the active portion is raised relative to the inner passive portion.

16. The device of claim 1, further comprising a processor in electrical communication with the thermoelectric module, the processor configured to cause the thermoelectric module to generate heat flux through the heat transfer surface, wherein a heat flux through the active portion is between 500 and 15,000 W/m$^2$.

17. The device of claim 1, further comprising a power source coupled to the thermoelectric module, and wherein the thermoelectric module is configured to actively heat and/or cool the surface.

* * * * *